US008902690B2

(12) United States Patent
Gopalakrishnan et al.

(10) Patent No.: US 8,902,690 B2
(45) Date of Patent: *Dec. 2, 2014

(54) DECODING SCHEME FOR BIPOLAR-BASED DIODE THREE-DIMENSIONAL MEMORY REQUIRING UNIPOLAR PROGRAMMING

(75) Inventors: Kailash Gopalakrishnan, San Jose, CA (US); Chung H. Lam, Peekskill, NY (US); Jing Li, Ossining, NY (US); Robert K. Montoye, Rocheter, MN (US)

(73) Assignee: International Business Machines Corporation, Armonk, NY (US)

( * ) Notice: Subject to any disclaimer, the term of this patent is extended or adjusted under 35 U.S.C. 154(b) by 106 days.

This patent is subject to a terminal disclaimer.

(21) Appl. No.: 13/584,423

(22) Filed: Aug. 13, 2012

(65) Prior Publication Data
US 2014/0022851 A1 Jan. 23, 2014

Related U.S. Application Data

(63) Continuation of application No. 13/551,597, filed on Jul. 17, 2012.

(51) Int. Cl.
*G11C 8/00* (2006.01)
(52) U.S. Cl.
USPC ....... 365/230.06; 365/175; 365/206; 365/226
(58) Field of Classification Search
CPC .............. G11C 5/14; G11C 7/12; G11C 8/08; G11C 8/10; G11C 11/36; G11C 7/02
USPC .............................. 365/226, 230.06, 175, 206
See application file for complete search history.

(56) References Cited

U.S. PATENT DOCUMENTS

| 4,617,653 | A | 10/1986 | Matsuzaki et al. ............ 365/230 |
| 4,660,178 | A | 4/1987 | Hardee et al. .................. 365/189 |
| 7,382,647 | B1 | 6/2008 | Gopalakrishnan ............ 365/163 |
| 7,499,366 | B2 * | 3/2009 | Scheuerlein et al. ..... 365/230.06 |
| 7,573,736 | B2 | 8/2009 | Wang et al. .................... 365/158 |
| 8,509,025 | B2 * | 8/2013 | Scheuerlein et al. ..... 365/230.06 |
| 2010/0014346 | A1 | 1/2010 | Lou et al. ...................... 365/171 |
| 2010/0054030 | A1 | 3/2010 | Lowrey ......................... 365/163 |
| 2010/0085830 | A1 | 4/2010 | Shepard ................... 365/230.06 |
| 2010/0110765 | A1 | 5/2010 | Tian et al. ..................... 365/148 |
| 2010/0118590 | A1 | 5/2010 | Carter et al. .................. 365/148 |

OTHER PUBLICATIONS

G. W. Burr et al., "Overview of candidate device technologies for storage-class memory," IBM Journal of Research and Development, vol. 52, Issues 4, 5, Jul. 2008, pp. 449-464.

* cited by examiner

*Primary Examiner* — Vanthu Nguyen
(74) *Attorney, Agent, or Firm* — Ido Tuchman; Vazken Alexanian (57) ABSTRACT

A system and method for operating a unipolar memory cell array including a bidirectional access diode. An example embodiment is a method including determining if the operating state of the unipolar memory cell is in a select state or a deselect state and the programming state is a read state or a write state. The method switches a column voltage switch based on the operating state and the programming state of the unipolar memory cell. The method further switches a row voltage switch based on the operating state and the programming state of the unipolar memory cell.

13 Claims, 8 Drawing Sheets

DECODING SCHEME FOR BIPOLAR-BASED DIODE THREE-DIMENSIONAL MEMORY REQUIRING UNIPOLAR PROGRAMMING

CROSS-REFERENCE TO RELATED APPLICATIONS

This application claims priority under 35 U.S.C. §120 to U.S. patent application Ser. No. 13/551,597 filed Jul. 17, 2012, the entire text of which is specifically incorporated by reference.

BACKGROUND

This invention relates to memory in semiconductor devices. More particularly, the present invention relates to a system and method for operating memory cells and drive circuits on unipolar memory devices.

Nonvolatile memory solutions are a growing focus for the next generation of memory devices. Where floating-gate transistors satisfy many current commercial needs, expansion and improvement in the industry may require the next generation of memory storage to work with unipolar and bipolar memory types. Resistive random-access memory (RRAM), phase change memory (PCM), magnetoresistive random-access memory (MRAM), and other memory types present new challenges in integrating memory elements into current memory devices. In particular, finding a memory design that allows for greater memory cell densities on a semiconductor chip may provide for greater memory array efficiency and reliability.

A central problem associated with present memory devices is that peripheral circuitry provides a large area overhead on the semiconductor wafer, which results in less space available for the memory cell array. For example, past solutions for implementing more efficient memory devices involved utilizing multiple semiconductor wafers to fashion the memory device or stack unipolar memory cells on top of each other. These solutions, however, regularly experience problems with significant wiring.

BRIEF SUMMARY

Accordingly, one example aspect of the present invention is a method of operating a unipolar memory cell array including a bidirectional access diode. The method includes determining if an operating state of the unipolar memory cell is a select state or a deselect state. The method also includes determining if a programming state is a read state or a write state. A switching step switches an output signal of a column voltage switch to a select column voltage if the operating state is the select state. A switching step switches the output signal of the column voltage switch to a read deselect column voltage if the operating state is the deselect state and the programming state is the read state. Another switching step switches the output signal of the column voltage switch to a write deselect column voltage if the operating state is the deselect state and the programming state is the write state. A further switching step switches the output signal of a row voltage switch to a read select row voltage if the operating state is the select state and the programming state is the read state. Another switching step switches the output signal of the row voltage switch to a write select row voltage if the operating state is the select state and the programming state is the write state. Another switching step switches the output signal of the row voltage switch to a read deselect row voltage if the operating state is the deselect state and the programming state is the read state. Yet another switching step switches the output signal of the row voltage switch to a write deselect row voltage if the operating state is the deselect state and the programming state is the write state.

Another example aspect of the present invention is a method for operating a unipolar memory cell array including a bidirectional access diode. The method includes determining if an operating state of the unipolar memory cell is a select state or a deselect state; determining if a programming state of the unipolar memory cell is a read state or a write state; switching an output signal of a column voltage switch to a read select column voltage if the operating state is the select state and the programming state is the read state; switching an output signal of the column voltage switch to a write select column voltage if the operating state is the select state and the programming state is the write state; switching an output signal of the column voltage switch to a deselect column voltage if the operating state is the deselect state; switching an output signal of a row voltage switch to a read select row voltage if the operating state is the select state and the programming state is the read state; switching an output signal of the row voltage switch to a write select row voltage if the operating state is the select state and the programming state is the write state; and switching an output signal of the row voltage switch to a deselect row voltage if the operating state is the deselect state.

DETAILED DESCRIPTION

The present invention is described with reference to embodiments of the invention, but shall not be limited to the referenced embodiments. Throughout the description of the present invention, references are made to FIGS. 1A through 8. When referring to the figures, like structures and elements shown throughout are indicated with like reference numerals.

Embodiments of the present invention provide possible systems for operating a unipolar memory cell with a bidirectional access diode, and possible methods for selecting from a plurality of bias voltages in such a system. The present invention is applicable to any three-dimensional memory array including unidirectional write operations.

An aspect of the present invention provides a multistage decoding scheme for a bidirectional diode unipolar memory cell. Embodiments of the present invention provide that the first stage decoding scheme elements be directly coupled to the bidirectional access diode. The second stage decoding scheme elements and other circuitry can be shared by a plurality of first stage decoding scheme elements. The bias voltages can be from an external source or on-chip voltage generation circuitry. Such a mechanism is advantageous in providing efficient voltage selection in high density memory arrays.

Figure 1A:
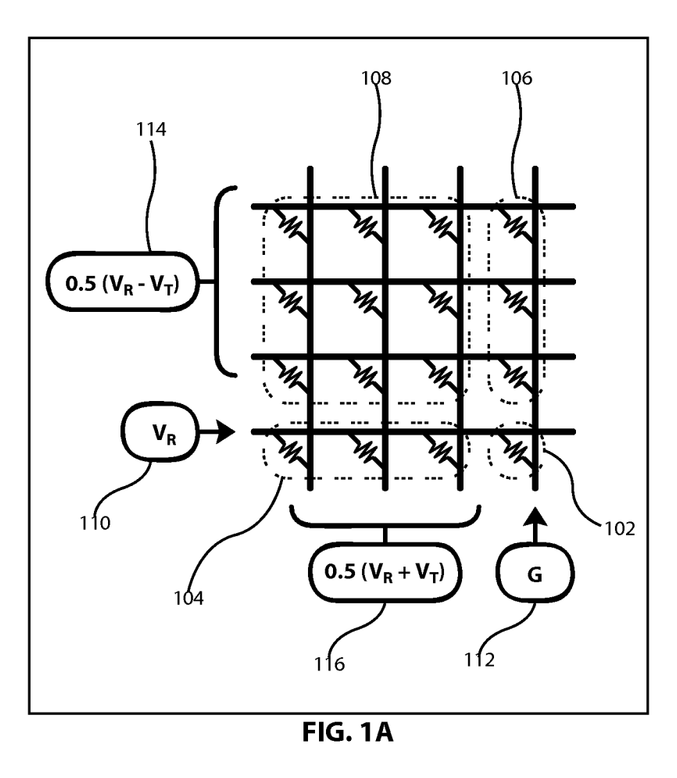
FIG. 1A is a diagram of an example unipolar memory cell array including bidirectional access diodes during a read state in accordance to one embodiment of the present invention.
Figure 1B:
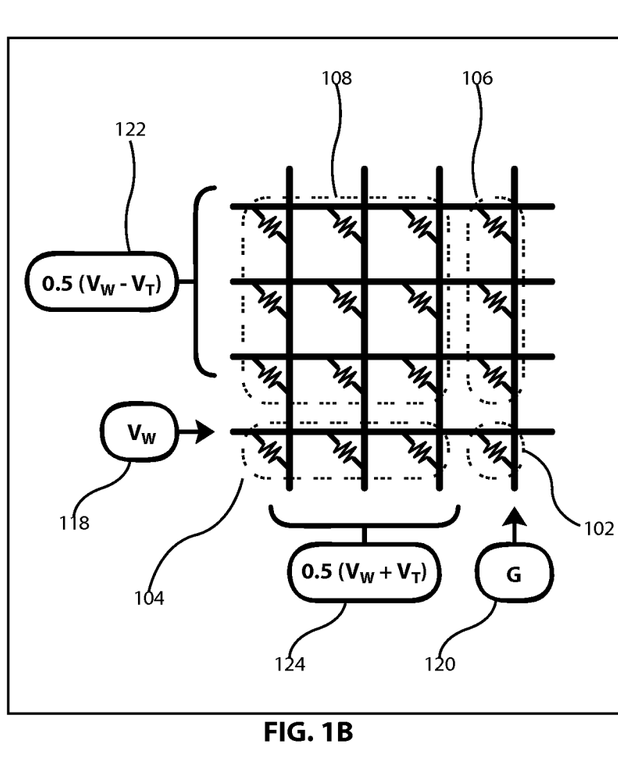
FIG. 1B is a diagram of an example unipolar memory cell array including bidirectional access diodes during a write state in accordance to one embodiment of the present invention.

FIGS. 1A and 1B display two diagrams of an example unipolar memory cell array 100 including bidirectional access diodes in accordance with one embodiment of the present invention. In this embodiment, the row lines represent the bit lines and the column lines represent the word lines.

The memory array 100 includes a memory cell in a select state 102, a plurality of memory cells in a select row 104, a plurality of memory cells in a select column 106, and a plurality of memory cells in a deselect state 108.

The memory array 100 further includes a read select row voltage 110, a read select column voltage 112 a deselect row voltage 114, and a deselect column voltage 116. The memory array 100 also includes a write select row voltage 118 and a write select column voltage 120.

FIG. 1A is a diagram of the example unipolar memory cell array during a read state. During the read state, the plurality of memory cells in a select row 104 and the memory cell in a select state 102 are coupled to the read select row voltage 110. The plurality of memory cells in a select column 106 and the memory cell in a select state are coupled to the read select column voltage 112.

Additionally, during the read state, the plurality of memory cells in a deselect state 108 and the plurality of memory cells in a select column 106 are coupled to the read deselect row voltage 114. Also, the plurality of memory cells in a deselect state 108 and the plurality of memory cells in a select row 104 are coupled to the read deselect column voltage 116.

FIG. 1B is a diagram of the example unipolar memory cell array during a write state. During the write state, the plurality of memory cells in a select row 104 and the memory cell in a select state 102 are coupled to the write select row voltage 118. The plurality of memory cells in a select column 106 and the memory cell in a select state are coupled to the write select column voltage 120.

Additionally, during the write state, the plurality of memory cells in a deselect state 108 and the plurality of memory cells in a select column 106 are coupled to the write deselect row voltage 122. Also, the plurality of memory cells in a deselect state 108 and the plurality of memory cells in a select row 104 are coupled to the write deselect column voltage 124.

Figure 2A:
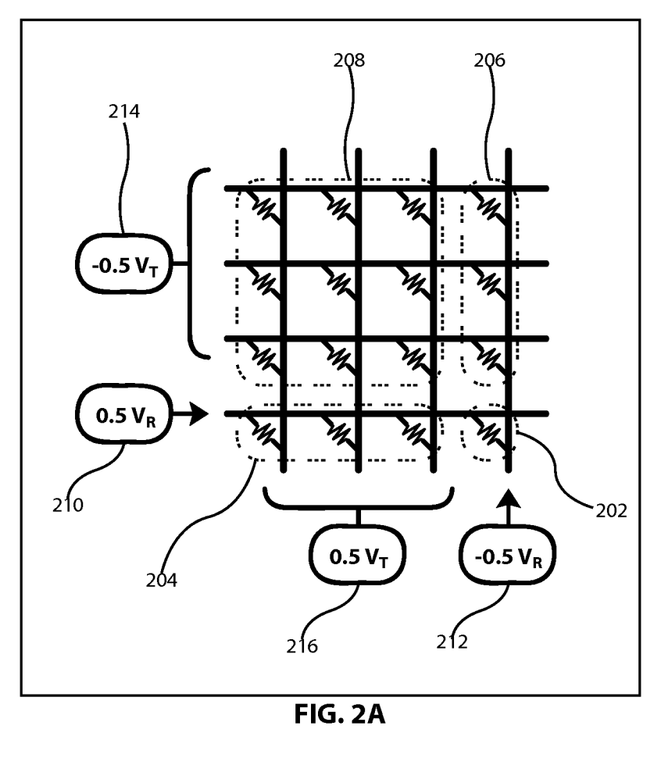
FIG. 2A is a diagram of an example unipolar memory cell array including bidirectional access diodes during a read state in accordance to one embodiment of the present invention.
Figure 2B:
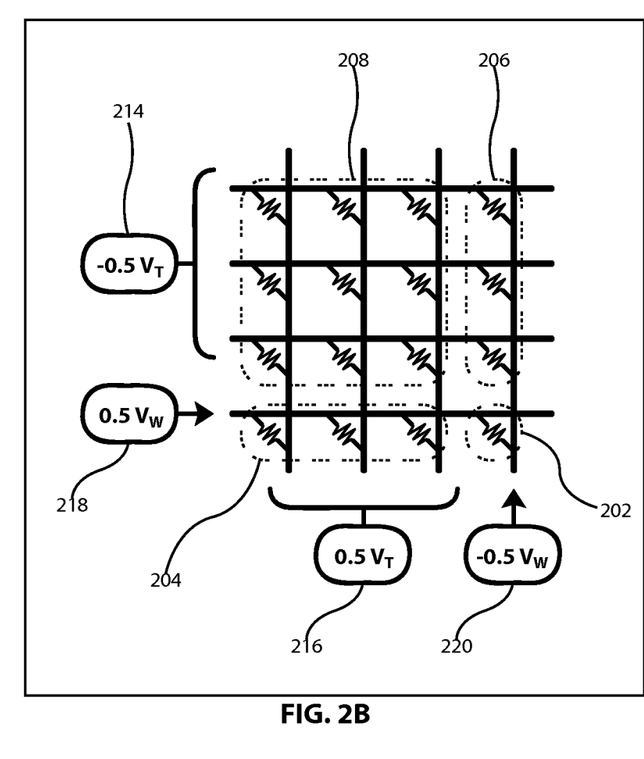
FIG. 2B is a diagram of an example unipolar memory cell array including bidirectional access diodes during a write state in accordance to one embodiment of the present invention.

FIGS. 2A and 2B displays two diagrams of an example unipolar memory cell array 200 including bidirectional access diodes in accordance to one embodiment of the present invention. In this embodiment, the row lines represent the bit lines and the column lines represent the word lines.

The memory array 200 includes a memory cell in a select state 202, a plurality of memory cells in a select row 204, a plurality of memory cells in a select column 206, and a plurality of memory cells in a deselect state 208.

The memory array 200 further includes a read select row voltage 210, a read select column voltage 212 a deselect row voltage 214, and a deselect column voltage 216. The memory array 200 also includes a write select row voltage 218 and a write select column voltage 220.

FIG. 2A is a diagram of the example unipolar memory cell array during a read state. During the read state, the plurality of memory cells in a select row 204 and the memory cell in a select state 202 are coupled to the read select row voltage 210. The plurality of memory cells in a select column 206 and the memory cell in a select state are coupled to the read select column voltage 212.

FIG. 2B is a diagram of the example unipolar memory cell array during a write state. During the write state, the plurality of memory cells in a select row 204 and the memory cell in a select state 202 are coupled to the write select row voltage 218. The plurality of memory cells in a select column 206 and the memory cell in a select state are coupled to the write select column voltage 220.

Additionally, during both read and write states, the plurality of memory cells in a deselect state 208 and the plurality of memory cells in a select column 206 are coupled to the deselect row voltage 214. Also during both read and write states, the plurality of memory cells in a deselect state 208 and the plurality of memory cells in a select row 204 are coupled to the deselect column voltage 216.

Figure 3:
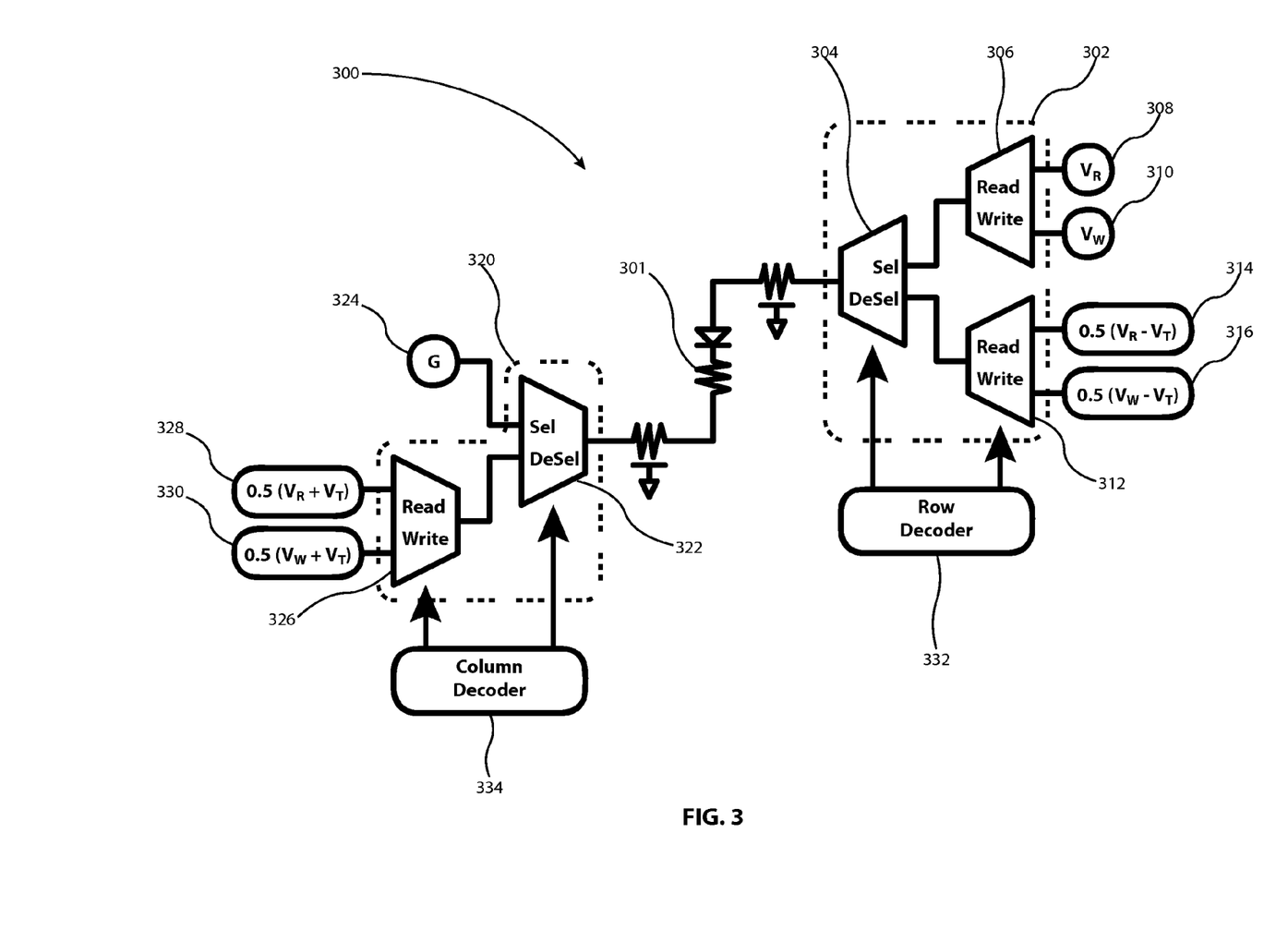
FIG. 3 is a diagram of an example system for operating a decoding circuit for a unipolar memory cell including a bidirectional access diode in accordance to one embodiment of the present invention.

FIG. 3 is a diagram of an example system for operating a unipolar memory cell including a bidirectional access diode in accordance to one embodiment of the present invention. The system includes a decoding circuit 300. The decoding circuit 300 includes a row voltage switch 302. The row voltage switch 302 includes an output electrically coupled to the bidirectional access diode 301. The bidirectional access diode includes a threshold voltage ($V_T$).

In one embodiment, the row voltage switch 302 includes a first stage row multiplexer 304, wherein an output of the first stage row multiplexer 304 is electrically coupled to the unipolar memory cell 301. The row voltage switch 302 also includes a second stage select row multiplexer 306, wherein an output of the second stage select row multiplexer 306 is electrically coupled to the first stage row multiplexer 304. The second stage select row multiplexer 306 is electrically coupled to a read select row voltage 308 ($V_R$) and a write select row voltage 310 ($V_W$).

The row voltage switch 302 also includes a second stage deselect row multiplexer 312, wherein an output of the second stage deselect row multiplexer 312 is electrically coupled to the first stage row multiplexer 304. The second stage deselect row multiplexer 312 is electrically coupled to a read deselect row voltage 314 and a write deselect row voltage 316.

The read deselect row voltage 314 is equal to one half the difference between the read select row voltage 308 and the threshold voltage. The write deselect row voltage 316 is equal to one half the difference between the write select row voltage 310 and the threshold voltage.

The decoding circuit 300 also includes a column voltage switch 320. The column voltage switch 320 includes an output electrically coupled to the bidirectional access diode 301.

The column voltage switch 320 includes a first stage column multiplexer 322, wherein an output of the first stage column multiplexer 322 is electrically coupled to the unipolar memory cell 301. The first stage column multiplexer 322 is electrically coupled to a select column voltage 324, wherein the select column voltage 324 is equal to a ground voltage (G).

The column voltage switch 320 also includes a second stage deselect column multiplexer 326, wherein an output of the second stage deselect column multiplexer 326 is electrically coupled to the first stage column multiplexer 322. The second stage deselect column multiplexer 326 is electrically coupled to a read deselect column voltage 328 and a write deselect column voltage 330.

The read deselect column voltage 328 is equal to one half the sum of the read select row voltage 308 and the threshold voltage. The write deselect column voltage 330 is equal to one half the sum of the write select row voltage 310 and the threshold voltage.

The decoding circuit 300 also includes a row decoder 332 to control the row multiplexers. The row decoder 332 is electrically coupled to a select line of the first stage row multiplexer 304, a select line of the second stage select row multiplexer 306, and a select line of the second stage deselect row multiplexer 312.

The decoding circuit 300 also includes a column decoder 334 to control the column multiplexers. The column decoder 334 is electrically coupled to a select line of the first stage column multiplexer 322, and a select line of the second stage deselect column multiplexer 326.

Figure 4:
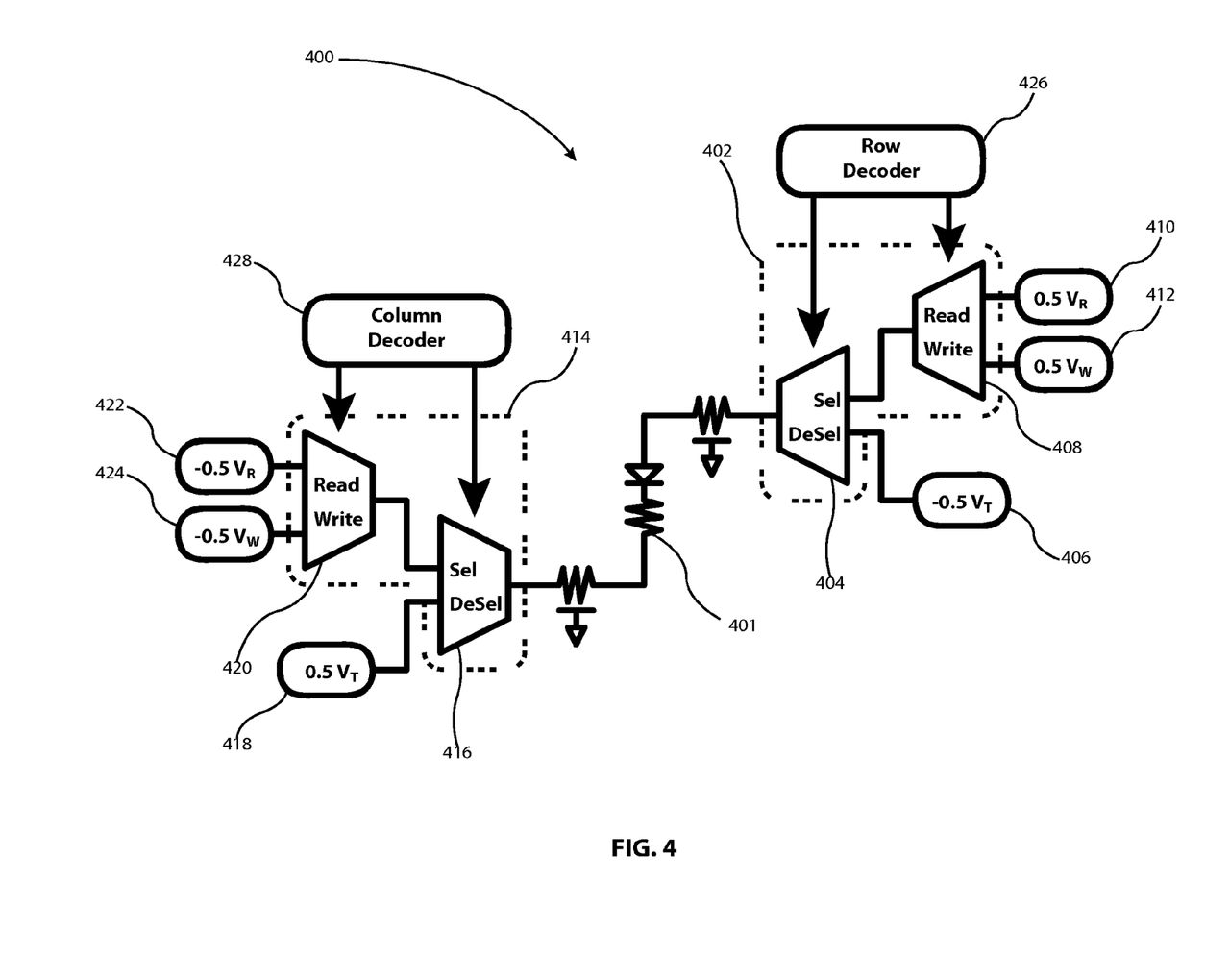
FIG. 4 is a diagram of an example system for operating a decoding circuit for a unipolar memory cell including a bidirectional access diode in accordance to one embodiment of the present invention.

FIG. 4 is a diagram of an example system for operating a unipolar memory cell including a bidirectional access diode in accordance to one embodiment of the present invention. The system includes a decoding circuit 400. The decoding circuit 400 includes a row voltage switch 402. The row voltage switch 402 includes an output electrically coupled to the bidirectional access diode 401. The bidirectional access diode includes a threshold voltage ($V_T$).

The row voltage switch 402 includes a first stage row multiplexer 404, wherein an output of the first stage row multiplexer 404 is electrically coupled to the unipolar memory cell 401. The first stage row multiplexer 404 is electrically coupled to a deselect row voltage 406, wherein the deselect row voltage 406 is equal to negative one half of the threshold voltage.

The row voltage switch 402 also includes a second stage select row multiplexer 408, wherein an output of the second stage select row multiplexer 408 is electrically coupled to the first stage row multiplexer 404. The second stage select row multiplexer 408 is electrically coupled to a read select row voltage 410 and a write select row voltage 412.

The read select row voltage 410 is equal to one half a read bias voltage ($V_R$). The write select row voltage 412 is equal to one half of a write bias voltage ($V_W$).

The decoding circuit 400 also includes a column voltage switch 414. The column voltage switch 414 includes an output electrically coupled to the bidirectional access diode 401.

The column voltage switch 414 includes a first stage column multiplexer 416, wherein an output of the first stage column multiplexer 416 is electrically coupled to the unipolar memory cell 401. The first stage column multiplexer 416 is electrically coupled to a deselect column voltage 418, wherein the deselect column voltage 418 is equal to one half of the threshold voltage.

The column voltage switch 414 also includes a second stage select column multiplexer 420, wherein an output of the second stage select column multiplexer 420 is electrically coupled to the first stage column multiplexer 416. The second stage select column multiplexer 420 is electrically coupled to a read select column voltage 422 and a write select column voltage 424.

The read select column voltage 422 is equal to negative one half of the read bias voltage (V-R). The write select column voltage 424 is equal to negative one half of the write bias voltage ($V_w$).

The decoding circuit 400 also includes a row decoder 426. The row decoder 426 is electrically coupled to a select line of the first stage row multiplexer 404, and a select line of the second stage select row multiplexer 408.

The decoding circuit 400 also includes a column decoder 428. The column decoder 428 is electrically coupled to a select line of the first stage column multiplexer 416, and a select line of the second stage select column multiplexer 420.

Figure 5:
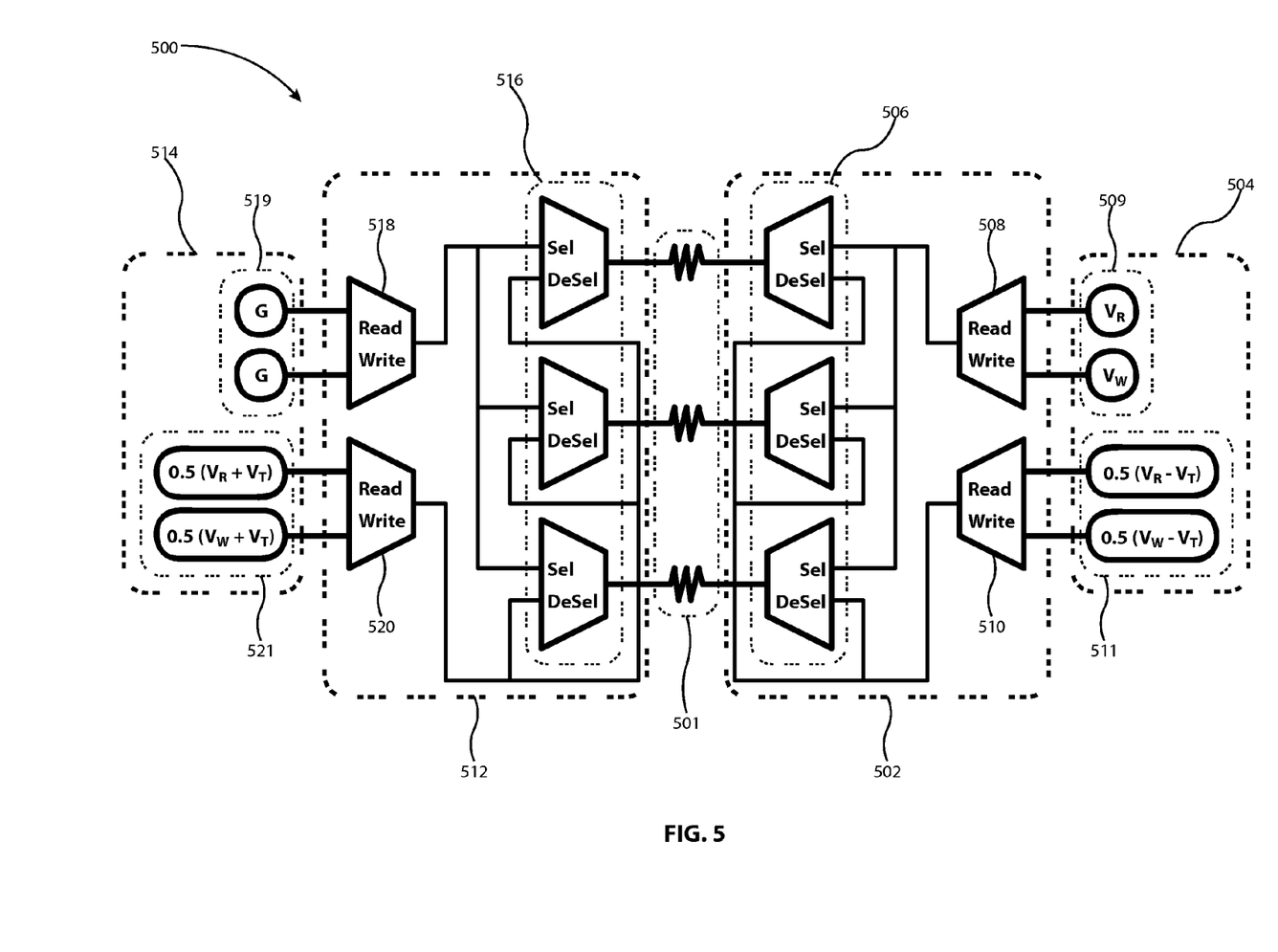
FIG. 5 is a diagram of an example system for operating a plurality of unipolar memory cells including bidirectional access diodes in accordance to one embodiment of the present invention.

FIG. 5 is a diagram of an example system for operating a plurality of unipolar memory cells including bidirectional access diodes in accordance to one embodiment of the present invention. The system includes a decoding circuit 500. The decoding circuit 500 includes a row voltage switch 502. The row voltage switch 502 includes an output signal electrically coupled to a plurality of bidirectional access diodes 501. The row voltage switch 502 is also electrically coupled to a plurality of row voltages 504.

The row voltage switch 502 also includes a plurality of first stage row multiplexers 506. The plurality of first stage row multiplexers 506 include output signals electrically coupled to the plurality of bidirectional access diodes 501.

The row voltage switch 502 also includes a second stage select row multiplexer 508. The second stage select row multiplexer 508 includes an output signal electrically coupled to the plurality of first stage multiplexers 506. The second stage select row multiplexer 508 is also electrically coupled to select row voltages 509.

The row voltage switch 502 also includes a second stage deselect row multiplexer 510. The second stage deselect row multiplexer 510 includes an output signal electrically coupled to the plurality of first stage multiplexers 506. The second stage deselect row multiplexer 510 is also electrically coupled to deselect row voltages 511.

The decoding circuit 500 also includes a column voltage switch 512. The column voltage switch 502 includes an output signal electrically coupled to a plurality of bidirectional access diodes 501. The column voltage switch 512 is also electrically coupled to a plurality of column voltages 514.

The column voltage switch 512 also includes a plurality of first stage column multiplexers 516. The plurality of first stage column multiplexers 516 include output signals electrically coupled to the plurality of bidirectional access diodes 501.

The column voltage switch 512 also includes a second stage select column multiplexer 518. The second stage select column multiplexer 518 includes an output signal electrically coupled to the plurality of first stage column multiplexers 516. The second stage select column multiplexer 518 is also electrically coupled to select row voltages 519.

The column voltage switch 512 also includes a second stage deselect column multiplexer 520. The second stage deselect column multiplexer 520 includes an output signal electrically coupled to the plurality of first stage multiplexers 516. The second stage deselect column multiplexer 520 is also electrically coupled to deselect row voltages 521.

Figure 6:
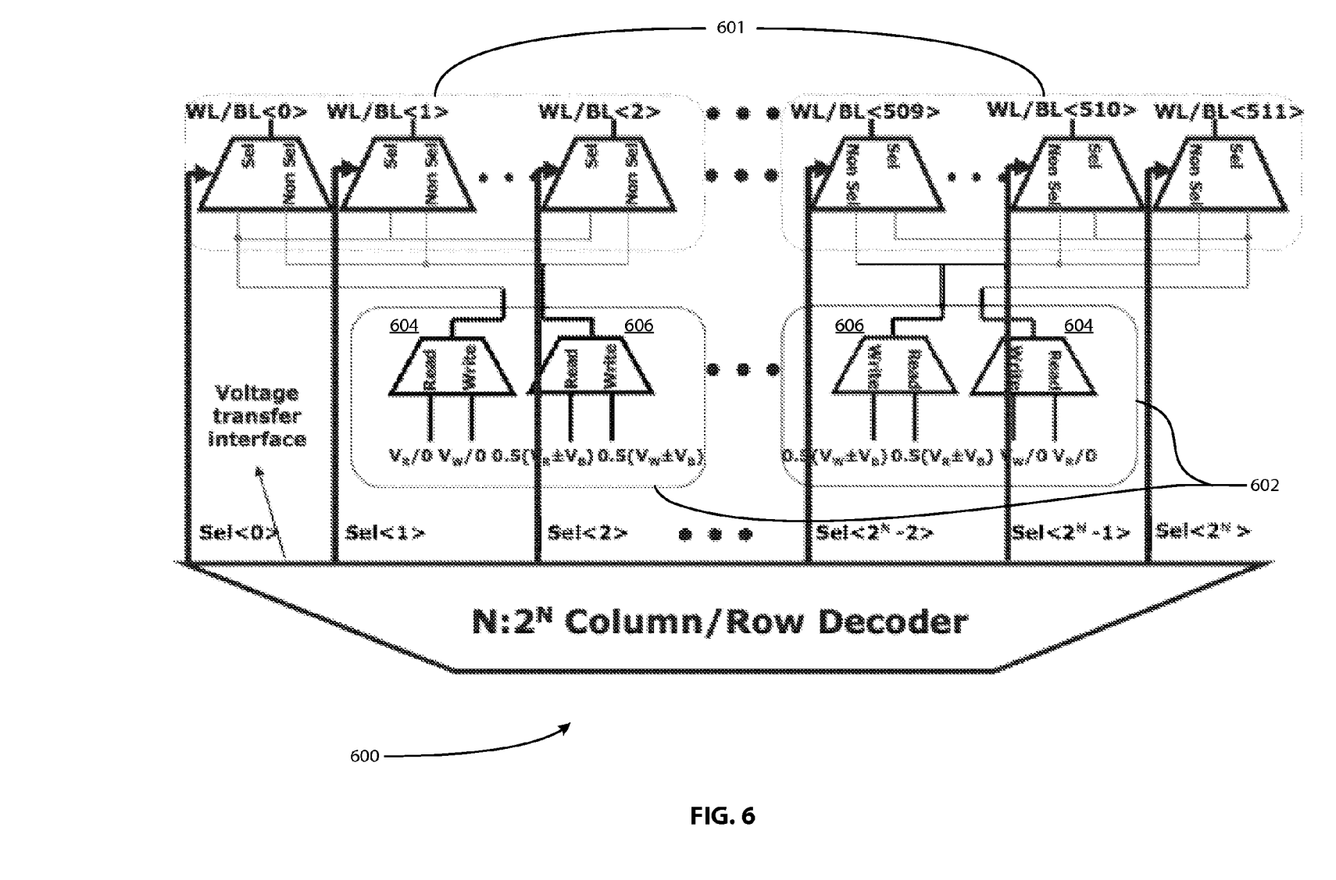
FIG. 6 is a diagram of an example voltage switch for a unipolar memory cell in accordance to one embodiment of the present invention.

FIG. 6 is a diagram of another example system for operating a unipolar memory cell in accordance to one embodiment of the present invention. The system includes a voltage switch 600, wherein the voltage switch 600 may be a row voltage switch or column voltage switch. In this embodiment, the voltage switch 600 includes first stage decoding scheme elements 601 and second stage decoding scheme elements 602. The second stage decoding scheme elements 602 are shared by a plurality of first stage decoding scheme elements 601.

The second stage decoding scheme elements 602 include at least one second stage select multiplexers 604 and at least one second stage deselect multiplexers 606.

The first stage decoding scheme elements 601 include a plurality of first stage multiplexers. Each first stage multiplexer includes an output electrically coupled to a different bidirectional access diode (not shown in figure). Furthermore, each first stage multiplexer is electrically coupled to at least one second stage select multiplexer 604 and at least one second stage deselect multiplexer 606.

Figure 7:
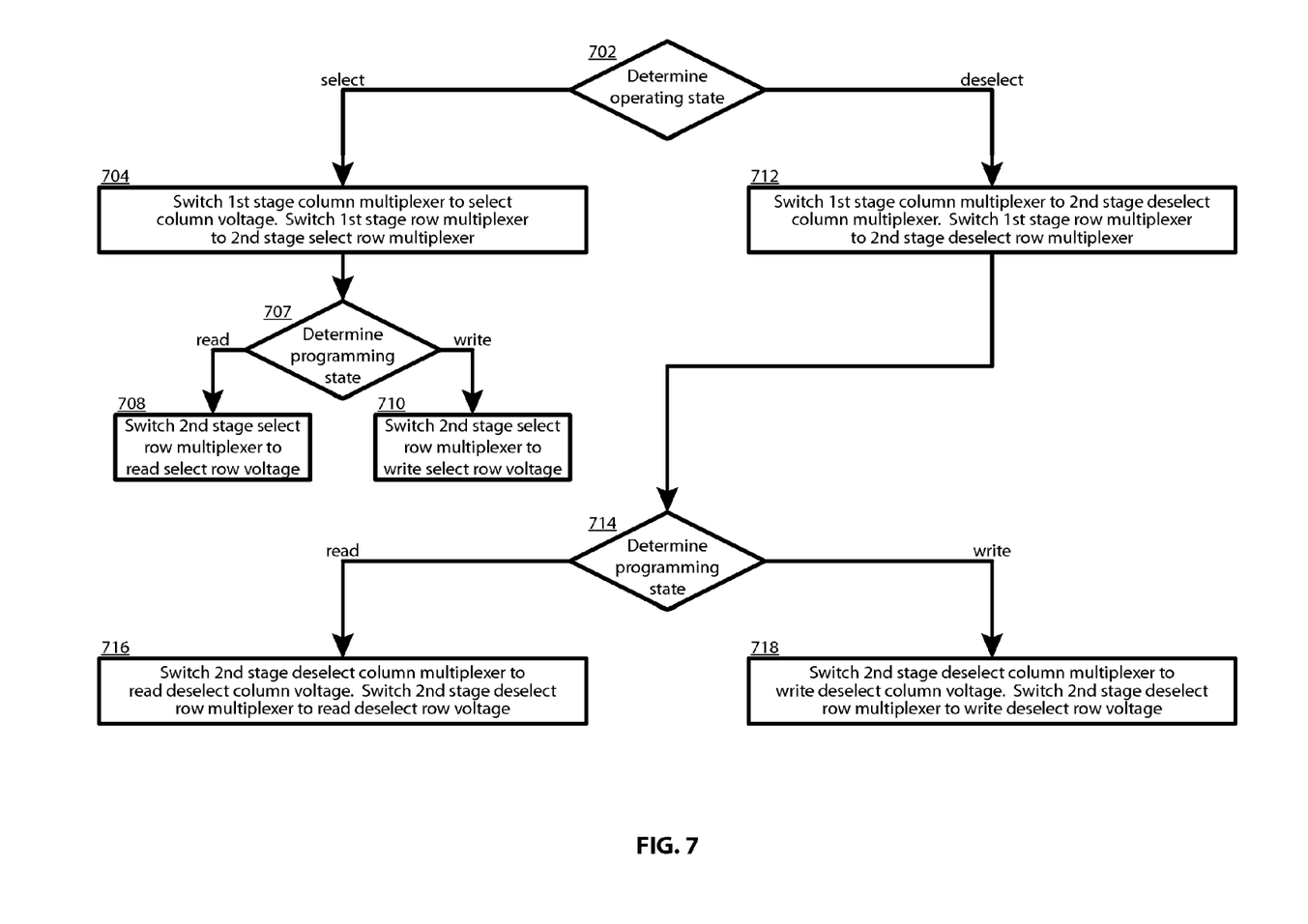
FIG. 7 is a flowchart illustrating an example method for operating a unipolar memory cell including a bidirectional access diode in accordance to one embodiment of the present invention.

FIG. 7 is a flowchart illustrating an example method for operating a unipolar memory cell including a bidirectional access diode in accordance to one embodiment of the present invention. The method begins with determining step 702. At determining step 702, the operating state of the unipolar memory cell is determined as one of a select state or a deselect state.

If the operating state is one of a select state, the method proceeds to switching step 704. At switching step 704, the output signal of the first stage column multiplexer 322 is switched to the select column voltage 324 and the output signal of the first stage row multiplexer 304 is switched to the output signal of the second stage select row multiplexer 306. After switching step 704, the method proceeds to determining step 707.

At determining step 707, the programming state of the unipolar memory cell is determined as one of a read state or a write state. If the programming state is one of a read state, the method proceeds to switching step 708. If the programming state is one of a write state, the method proceeds to switching step 710.

At switching step 708, the output signal of the second stage select row multiplexer 306 is switched to the read select row voltage 308. After switching step 708 ends, the method is complete.

At switching step 710, the output signal of the second stage select row multiplexer 306 is switched to the write select row voltage 310. After switching step 710 ends, the method is complete.

If the operating state is one of a deselect state, the method proceeds to switching step 712. At switching step 712, the output signal of the first stage column multiplexer 322 is switched to the output of the second stage deselect column multiplexer 326. At switching step 712, the output signal of the first stage row multiplexer 304 is switched to a second stage deselect row multiplexer 312. After switching step 712, the method proceeds to determining step 714.

At determining step 714, the programming state of the unipolar memory cell is determined as one of a read state or a write state. If the programming state is one of a read state, the method proceeds to switching step 716. If the programming state is one of a write state, the method proceeds to switching step 718.

At switching step 716, the output signal of the second stage deselect row multiplexer 312 is switched to the read deselect row voltage 314. After switching step 716 ends, the method is complete.

At switching step 718, the output signal of the second stage deselect row multiplexer 312 is switched to the write deselect row voltage 316. After switching step 718 ends, the method is complete.

Figure 8:
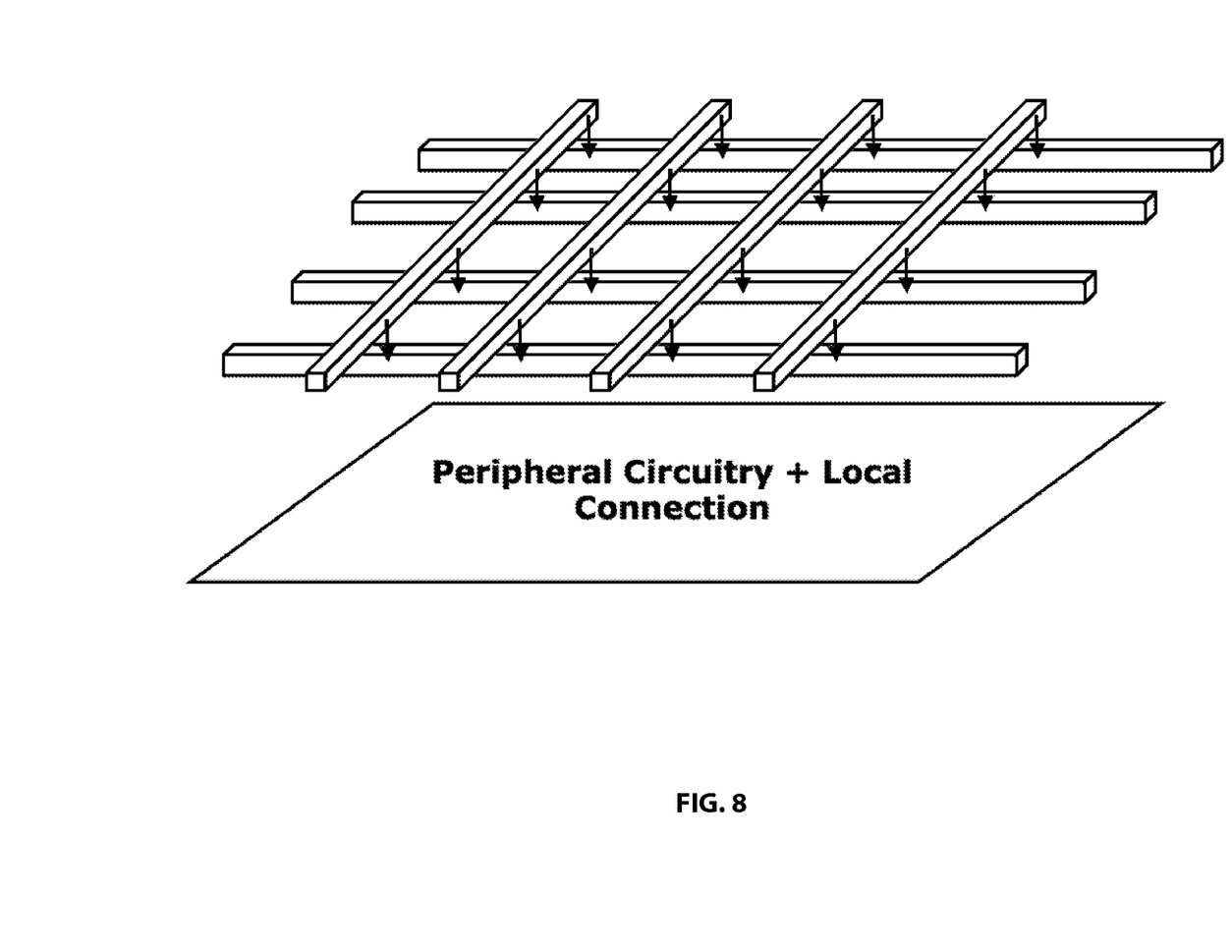
FIG. 8 is a diagram of an example configuration for a unipolar memory cell array including a bidirectional access diode in accordance to one embodiment of the present invention.

FIG. 8 is a diagram of an example configuration for a unipolar memory cell array including a bidirectional access diode in accordance to one embodiment of the present invention. In this embodiment, the circuitry described in the embodiments above are located below the bit line, word line and memory cells.

The horizontal bars represent the bit lines in the memory array. The vertical bars represent the word lines in the memory array. The memory cells are represented by the downward arrows between the word and bit lines. The element below the array represents the decoding circuitry and local connections.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for operating a unipolar memory cell array including a bidirectional access diode, the method comprising:
   determining if an operating state of the unipolar memory cell is one of a select state and a deselect state;
   determining if a programming state of the unipolar memory cell is one of a read state and a write state;
   switching an output signal of a column voltage switch to a select column voltage if the operating state is the select state;
   switching the output signal of the column voltage switch to a read deselect column voltage if the operating state is the deselect state and the programming state is the read state;
   switching the output signal of the column voltage switch to a write deselect column voltage if the operating state is the deselect state and the programming state is the write state;
   switching the output signal of a row voltage switch to a read select row voltage if the operating state is the select state and the programming state is the read state;
   switching the output signal of the row voltage switch to a write select row voltage if the operating state is the select state and the programming state is the write state;
   switching the output signal of the row voltage switch to a read deselect row voltage if the operating state is the deselect state and the programming state is the read state; and
   switching the output signal of the row voltage switch to a write deselect row voltage if the operating state is the deselect state and the programming state is the write state;
   switching an output signal of a first stage column multiplexer to the select column voltage if the operating state is the select state, the first stage column multiplexer being electrically coupled to the unipolar memory cell;
   switching the output signal of the first stage column multiplexer to an output signal of a second stage column multiplexer if the operating state is the deselect state;
   switching the output signal of the first stage row multiplexer to an output signal of a second stage select row multiplexer if the operating state is the select state, the first stage row multiplexer being electrically coupled to the unipolar memory cell; and switching the output signal of the first stage row multiplexer to an output signal of a second stage deselect row multiplexer if the operating state is the deselect state.

2. A method for operating a unipolar memory cell array including a bidirectional access diode, the method comprising:

determining if an operating state of the unipolar memory cell is one of a select state and a deselect state;

determining if a programming state of the unipolar memory cell is one of a read state and a write state;

switching an output signal of a first stage column multiplexer to the select column voltage if the operating state is the select state, the first stage column multiplexer being electrically coupled to the unipolar memory cell;

switching the output signal of the first stage column multiplexer to an output signal of a second stage column multiplexer if the operating state is the deselect state, wherein the second stage column multiplexer is coupled to a read deselect column voltage and a write deselect column voltage;

switching the output signal of a first stage row multiplexer to an output signal of a second stage select row multiplexer if the operating state is the select state, the first stage row multiplexer being electrically coupled to the unipolar memory cell, wherein the second stage select row multiplexer is coupled to a read select row voltage and a write select row voltage; and switching the output signal of the first stage row multiplexer to an output signal of a second stage deselect row multiplexer if the operating state is the deselect state, wherein the second stage deselect row multiplexer is coupled to a read deselect row voltage and a write deselect row voltage.

3. The method of claim 1, further comprising determining if a programming state of the unipolar memory cell is one of a read state and a write state 4. The method of claim 3, further comprising:
switching the output signal of the second stage column multiplexer to the read deselect column voltage if the programming state is the read state; and
switching the output signal of the second stage column multiplexer to the write deselect column voltage if the programming state is the write.

5. The method of claim 4, further comprising:
switching the output signal of the second stage deselect row multiplexer to the read deselect row voltage if the programming state is the read state; and
switching the output signal of the second stage deselect row multiplexer to the write deselect row voltage if the programming state is the write.

6. The method of claim 5, further comprising:
switching the output signal of the second stage select row multiplexer to the read select row voltage if the programming state is the read state; and
switching the output signal of the second stage select row multiplexer to the write select row voltage if the programming state is the write state.

7. The method of claim 6, further comprising:
wherein the bidirectional access diode includes a threshold voltage;
wherein the select column voltage is a ground voltage;
wherein the read deselect column voltage is equal to one half the sum of the read select row voltage and the threshold voltage;

wherein the write deselect column voltage is equal to one half the sum of the write select row voltage and the threshold voltage;
wherein the read deselect row voltage is equal to one half the difference between the read select row voltage and the threshold voltage; and
wherein the write deselect row voltage is equal to one half the difference between the write select row voltage and the threshold voltage.

8. A method for operating a unipolar memory cell array including a bidirectional access diode, the method comprising:

determining if an operating state of the unipolar memory cell is one of a select state and a deselect state;

determining if a programming state of the unipolar memory cell is one of a read state and a write state;

switching an output signal of a first stage column multiplexer to an output signal of a second stage column multiplexer if the operating state is the select state, the first stage column multiplexer being electrically coupled to the unipolar memory cell, wherein the second stage column multiplexer is coupled to a read select column voltage and a write select column voltage;

switching the output signal of the first stage column multiplexer to the deselect column voltage if the operating state is the deselect state;

switching the output signal of a first stage row multiplexer to an output signal of a second stage select row multiplexer if the operating state is the select state, the first stage row multiplexer being electrically coupled to the unipolar memory cell, wherein the second stage select row multiplexer is coupled to a read select row voltage and a write select row voltage; and switching the output signal of the first stage row multiplexer to the deselect row voltage if the operating state is the deselect state.

9. The method of claim 8, further comprising:
switching the output signal of the second stage select row multiplexer to the read select row voltage if the programming state is the read state; and
switching the output signal of the second stage select row multiplexer to the write select row voltage if the programming state is the write state.

10. The method of claim 9, further comprising:
switching the output signal of the second stage column multiplexer to the read select column voltage if the programming state is the read state; and
switching the output signal of the second stage column multiplexer to the write select column voltage if the programming state is the write state.

11. The method of claim 10, further comprising:
wherein the deselect column voltage, read select row voltage, and the write select row voltage are positive voltages; and
wherein the deselect row voltage, the read select column voltage and the write select column voltage are negative voltages.

12. The method of claim 11, further comprising:
wherein the bidirectional access diode includes a threshold voltage;
wherein the deselect column voltage is equal to one half the threshold voltage;
wherein the read select column voltage is equal to negative one half the read select row voltage;
wherein the write select column voltage is equal to negative one half the write select row voltage; and wherein the deselect row voltage is equal to negative one half the threshold voltage.

13. The method of claim 1, further comprising:
wherein the bidirectional access diode includes a threshold voltage;
wherein the select column voltage is a ground voltage;
wherein the read deselect column voltage is equal to one half the sum of the read select row voltage and the threshold voltage;
wherein the write deselect column voltage is equal to one half the sum of the write select row voltage and the threshold voltage;
wherein the read deselect row voltage is equal to one half the difference between the read select row voltage and the threshold voltage; and
wherein the write deselect row voltage is equal to one half the difference between the write select row voltage and the threshold voltage.

* * * * *